United States Patent [19]
Sakusabe

[11] Patent Number: 5,789,963
[45] Date of Patent: Aug. 4, 1998

[54] LOW POWER CONSUMPTION MIXER AND FREQUENCY CONVERSION WITH INTER-TERMINAL ISOLATION FOR STABLE MIXING

[75] Inventor: Kenichi Sakusabe, Tokyo, Japan

[73] Assignee: Murata Manufacturing Co., Ltd., Japan

[21] Appl. No.: 825,961

[22] Filed: Apr. 4, 1997

Related U.S. Application Data

[63] Continuation of Ser. No. 549,052, Oct. 27, 1995, abandoned.

[30] Foreign Application Priority Data

Oct. 28, 1994 [JP] Japan .................. 6-264927
Oct. 26, 1995 [JP] Japan .................. 7-278681

[51] Int. Cl.$^6$ .................. H03D 7/16; H04B 1/28
[52] U.S. Cl. .................. 327/356; 327/113; 327/430; 355/326; 355/333
[58] Field of Search .................. 455/333, 326, 455/323, 313; 327/355, 356, 360, 119, 118, 117, 113, 430, 431, 361

[56] References Cited

U.S. PATENT DOCUMENTS

| | | | |
|---|---|---|---|
| 4,032,851 | 6/1977 | Hoover .................. | 355/332 |
| 4,490,854 | 12/1984 | Bensussan et al. .................. | 455/118 |
| 4,727,597 | 2/1988 | Dautriche .................. | 455/326 |
| 4,845,389 | 7/1989 | Pyndiah et al. .................. | 327/113 |
| 5,083,050 | 1/1992 | Vasile .................. | 307/529 |
| 5,323,123 | 6/1994 | Philippe .................. | 330/277 |
| 5,396,132 | 3/1995 | Shiga .................. | 327/113 |
| 5,465,419 | 11/1995 | Zimmermann .................. | 455/333 |
| 5,559,457 | 9/1996 | Uda et al. .................. | 327/113 |

FOREIGN PATENT DOCUMENTS

| | | | |
|---|---|---|---|
| 0006760 | 1/1980 | European Pat. Off. .................. | H03D 7/14 |
| 0087336 | 8/1983 | European Pat. Off. .................. | H03D 7/12 |
| 0549043 | 6/1993 | European Pat. Off. .................. | H03D 7/12 |
| 0587136 | 3/1994 | European Pat. Off. .................. | H03D 7/12 |
| 0590191 | 4/1994 | European Pat. Off. .................. | H03D 7/12 |
| 6-104651 | 4/1994 | Japan .................. | H03D 7/14 |

OTHER PUBLICATIONS

Kashiwagi, Michio, "Mixer Circuit" Patent Abstracts of Japan, vol. 007, No. 255 (E210) 12 Nov. 1983, and JP-A-58 141011 (Tokyo Shibaura Denki KK) 22 Aug. 1983, Abstract.
Joshin, et al., "A High-Gain Hemt Monolithic Downconverter for X-Band Direct Broadcast Satellite Applications", GAAS IC Symposium technical Digest 1993, 10-13 Oct. 1993, San Jose, U.S. pp. 229-232, XP 000462978, p. 230, column 1, para. 3; FIG. 5.

*Primary Examiner*—Toan Tran
*Assistant Examiner*—Terry L. Englund

[57] ABSTRACT

A low power consumption mixing circuit and process comprise first and second field effect transistors "FETs." The first and second FETs each have at least a control electrode and a drive electrode. The drive electrodes of the first and second FETs are coupled together by a capacitor. An AC signal is supplied to the control electrode of the first FET through a first matching circuit, and the first FET amplifies the AC signal. The capacitor removes the DC component from the amplified AC signal that appears at the drive electrode of the first FET. The amplified AC signal, which is free from the DC component, is provided to the drive electrode of the second FET. A second AC signal is supplied to the control electrode of the second FET by another matching circuit. The second FET mixes the first and second AC signals that are supplied to the drive electrode of the second FET. This mixed signal is then provided through an output matching circuit as a mixed output signal. A supply voltage is provided at the drive electrode of the first FET but no supply voltage is provided at the drive electrode of the second FET. Instead, a negative bias voltage is applied at the control electrode of the second FET which results in the DC current in the drive electrode of the second FET being in a saturation range which thereby provides improved mixing at the drive electrode and improved inter-terminal isolation.

10 Claims, 5 Drawing Sheets

LOW POWER CONSUMPTION MIXER AND FREQUENCY CONVERSION WITH INTER-TERMINAL ISOLATION FOR STABLE MIXING

This is a continuation of application Ser. No. 08/549,052 filed on Oct. 27, 1995, now abandoned.

BACKGROUND OF THE INVENTION a) Field of the Invention

This invention relates to a mixer using FETs (field-effect transistors) and also to a process of frequency conversion using such a mixer.

b) Prior Art Statement

A mixer is a circuit for mixing a plurality of signals, and usually it has an active element such as a bipolar transistor, an FET, etc. The active element serves to provide a signal which corresponds to the product of two (or more generally a plurality of) signals when these signals are supplied to it. Multiplying two (or more generally a plurality of) signals having different frequencies yields signals corresponding to the difference and sum of the frequencies of these different frequency signals, and this means that a mixer may be used as a frequency converter as well.

Among examples of frequency converters are a down-converter for converting a signal having a relatively high frequency into a lower frequency signal, and an up-converter for converting a signal having a relatively low frequency into a higher frequency signal. These down and up-converters function to supply a signal having a frequency corresponding to the difference or sum of the frequencies of two different input signals which are mixed, to a succeeding stage circuit. A superheterodyne receiver employs a down-converter for converting an RF (radio frequency) signal into an IF (intermediate frequency) signal and a down-converter for converting an IF signal into baseband signal. A direct conversion receiver employs a down-converter for converting an RF signal into a baseband signal. Conversely, a superheterodyne transmitter employs an up-converter for converting a baseband signal into an IF signal and an up-converter for converting an IF signal into an RF signal, and a direct conversion transmitter employs an up-converter for converting a baseband signal into an RF signal. For the frequency conversions as noted above, it is necessary to supply an LO (local oscillation) signal having a predetermined frequency as another input to the active element for mixing.

FIG. 7 shows a down-converter for converting an RF signal into an IF signal. The down-converter uses FET 1 having drain D, source S and gate G. The RF signal is supplied along with the LO signal through input matching circuits 3 and 4 to the gate G. The input matching circuits 3 and 4 have coupling capacitors C1 and C2 for eliminating the DC components of the RF and LO signals. The coupling capacitors C1 and C2 are connected to the junction between impedance elements Z1 and Z2 and to the junction between impedance elements Z3 and Z4, respectively, connected in series between the gate G and ground. The impedance elements Z1 to Z4 have their impedances set so as to match the impedance of the RF or LO signal transmission line and the input impedance of the gate G to each other. These impedance elements Z1 to Z4 may be implemented by distributed constant transmission lines such as microstrip lines.

The FET 1 has the source S grounded through a parallel circuit of self-bias resistor R and AC bypass capacitor C3 and the drain D connected through bias impedance element Z5 to positive DC power supply D1. Therefore, the RF and LO signals supplied to the gate G of the FET 1 are amplified and, at the same time, mixed by the FET 1 under a bias condition that is determined by the resistor R and impedance element Z5. The impedance element Z5, like the impedance elements Z1 to Z4, may be realized by a distributed constant transmission line. A capacitor C5 is connected to the power supply D1 for voltage regulation or similar purpose.

The drain D of the FET 1 is connected through output matching circuit 5 to the succeeding stage circuit. The output matching circuit 5 includes impedance elements Z6 to Z8 and capacitors C6 and C7. It has a function of matching the output impedance of the drain D and the succeeding stage circuit impedance, and also a filtering function of selectively passing the IF signal, i.e., the component having a frequency corresponding to the frequency difference between the RF and LO signals in the output of the drain D. Specifically, the impedance of the impedance element Z6 connected to the drain D and the capacitance of the capacitor C6 having one grounded terminal, are set such that the impedance element Z6 and the capacitor C6 serves as a low-pass filter for passing the IF signal in the frequency range in which the impedance element Z6 is inductive. Each of impedance elements Z7 and Z8 is open at one terminal thereof and converts the open terminal infinite impedance according to the electrical length thereof, i.e., it serves as an open stub, and their impedances are set such that they provide an impedance matching function in cooperation with the impedance element Z6 and capacitor C6. A capacitor C7 eliminates the DC component in the IF signal. The impedance elements Z6 to Z7 again may be realized with distributed constant transmission lines.

In the FIG. 7 down-converter which converts an RF signal into an IF signal in the above way, however, both the RF and LO signals are supplied to the gate G of the FET 1. Therefore, this down-converter poses a problem that the RF signal leaks to the LO signal input terminal or vice versa, that is, a problem that the inter-terminal isolation is inferior.

A first way to provide for improved inter-terminal isolation is to supply the LO signal to the source S instead of the gate G. With the RF and LO signals supplied to different electrodes (i.e., to the gate G and the source S, respectively) of the FET 1, the inter-terminal isolation is improved. However, supplying the LO signal to the source S reduces the power ratio of the IF signal to the RF signal, i.e., the conversion gain.

FIG. 8 shows a second way to improve the inter-terminal isolation. This circuit uses a dual-gate FET as the FET 1 to supply the RF and LO signals to respective gates G1 and G2. Again in this circuit, the RF and LO signals are supplied to different electrodes (i.e., to the gates G1 and G2, respectively) of the FET 1, and the inter-terminal isolation is improved. On the demerit side, the channel length is increased due to the two gates, thus requiring a greater DC drain current than in the single gate FET (see FIG. 7). An increased drain current causes increased power consumption on one hand and an increased NF (noise figure) of the FET 1, i.e., increased noise generated by the FET 1, thus leading to a mixer NF increase.

FIG. 9 shows a third way to improve the inter-terminal isolation. In this circuit, FET 2 for LO signal amplification is provided separately from FET 1 for RF signal amplification (see Japanese Patent Laid-Open Publication No. Hei 6-104651). In this down-converter, RF and LO signals are supplied to the gates G of the FETs 1 and 2, respectively.

Again, with the RF and LO signals supplied to the different electrodes, the inter-terminal isolation is improved. The FETs 1 and 2 each have the source S grounded and the drain D biased from power supply D1 through resistor R5 and inductor L5, and they amplify the RF and LO signals, respectively. The circuit is thus free from the problem as discussed above in connection with the first improved circuit.

However, since this circuit has two FETS, the sum of the DC drain currents in these FETs increases, thus increasing power consumption. Besides, although this circuit has a matching circuit X1 which has a complex conjugate impedance with respect to the drain-source impedances of the FETs 1 and 2 and is connected to the drains D of the FETs 1 and 2 to suppress reflection from the side of the inductor L5 to the side of the drains D of the FETs 1 and 2 for providing for corresponding conversion again improvement, according to Japanese Patent Laid-Open Publication No. Hei 6-104651 the conversion gain when the local input power, i.e., power of the LO signal, is 10 dBm, is improved only up to +0 dB.

SUMMARY OF THE INVENTION

An object of the invention is to suppress signal leakage from a particular input terminal to another input terminal, or from input terminal to output terminal, that is, to improve the inter-terminal isolation in a mixer. This object can be attained by permitting each input signal to be supplied to an exclusive electrode.

Another object of the invention is to prevent reduction of conversion gain due to failure of amplification of any of a plurality of signals to be mixed together. This object can be attained by mixing an AC signal supplied to the control electrode of the second active element with an amplified AC signal supplied from the first active element to the drive electrode of the second active element when a DC current in the drive electrode is in a saturation region.

A further object of the invention is to suppress the power of the LO signal when the invention is applied to a frequency converter. This object can be attained by attaining the preceding second object of the invention.

A still further object of the invention is to reduce the NF of the active element of a mixer, that is, to realize a low noise mixer. This object can be attained by using an active element having only a single control electrode (a single gate in the case of a FET).

A yet further object of the invention is to reduce the current passed through the active element of a mixer and thus reduce power consumption in the mixer. This object can be attained by reducing the number of active elements that are supplied with current from a DC power supply.

Yet another object of the invention is to attain the preceding fifth object of the invention without provision of any additional power supply. This object can be attained by a specific active element structure design.

A further object of the invention is to permit stable mixing operation irrespective of supply voltage variations. This object can be attained by mixing in an active element to which no DC power is supplied.

According to a first aspect of the invention, there is provided a mixer, which comprises a first active element having at least a control electrode and a drive electrode, the first active element amplifying an AC signal supplied to the control electrode in the presence of a supply voltage on the drive electrode, the amplified AC signal being provided from the drive electrode, a second active element having at least a control electrode and a drive electrode, the second active element mixing an AC signal supplied to the control electrode with an AC signal supplied to the drive electrode when a DC current in the drive electrode is in a saturation region, an AC signal that is obtained as a result of the mixing being provided from the drive electrode, first drive means for supplying a first AC signal to the control electrode of the first active element while applying the supply voltage to the drive electrode of the first active element, second drive means for supplying a second AC signal to the control electrode of the second active element while supplying the AC signal output from the drive electrode of the first active element to the drive electrode of the second active element, and output means for obtaining, from a signal appearing on the drive electrode of the second active element, a mixed signal having a frequency corresponding to the sum of, or difference between, the frequencies of the first and second AC signals.

According to this aspect of the invention, the active element to which the first AC signal (for instance RF signal) is applied and the one to which the second AC signal (for instance LO signal) is supplied, are different active elements, and improved inter-terminal isolation can be obtained. Further, since any active element needs only a single control electrode, the NF of each active element can be reduced. The drive electrode of the second active element, unlike the drive electrode of the first active element, is not provided with any DC voltage, which is desired in view of reducing power consumption. Moreover, it is the second active element free from DC voltage supply that executes the mixing operation, and a stable mixing operation can be obtained irrespective of supply voltage variations.

According to a second aspect of the invention, there is provided a frequency conversion process, which comprises the steps of preparing a first and a second FET, each having a gate, a drain and a source, applying a first AC signal voltage to the gate of the first FET while applying a DC supply voltage between the drain and source of the first FET, applying a second AC signal voltage to the gate of the second FET and a signal voltage between the drain and source of the second FET, the signal voltage being obtained by removing the DC component from the drain-source voltage across the first FET, while applying a negative bias voltage to the gate of the second FET to lower the knee voltage of the second FET so as to permit a mixing operation of the second FET using the AC component of the drain current in the first FET, and outputting, using the drain-source voltage across the second FET, a mixed signal voltage having a frequency corresponding to the sum of, or difference between, the frequencies of the first and second AC signal voltages.

According to a third aspect of the invention, there is provided a frequency conversion process, which comprises the steps of preparing a first and a second FET, each having a gate, a drain and a source, the gate of the second FET having a width smaller than the width of the gate of the first FET such that the drain current in the second FET is in a saturation region, applying a first AC signal voltage to the gate of the first FET while applying a DC supply voltage between the drain and source of the first FET, applying a second AC signal voltage to the gate of the second FET and a signal voltage between the drain and source of the second FET, the signal voltage being obtained from the drain-source voltage of the first FET by removing the DC component, and outputting, using the drain-source voltage across the second FET, a mixed signal voltage having a frequency corresponding to the sum of, or difference between, the frequencies of the first and second AC signal voltages.

Accordingly, in the second and third aspects of the invention, the mixing operation according to the first aspect is carried out while using the first and second FETs as the first and second active elements. Since the knee voltage of the second FET is adjusted so as to be held in such a condition that the drain DC current of the second FET is in the saturation region, a suitable mixing operation is realized. The adjustment is performed by biasing the gate of the second FET by the negative DC voltage in the second aspect and by designing the gate width of the second FET in the third aspect. In the second aspect, it is preferable to provide an isolation means to isolate the bias power supply from the second AC signal such that the second AC signal is not supplied to the bias power supply. In the third aspect, the bias power supply is not required.

When carrying out the invention, the matching of each active element and transmission line is suitably ensured. Specifically, the impedance matching of the control electrode of the first active element and the transmission line for transmitting the first AC signal, impedance matching of the control electrode of the second active element and the transmission line for transmitting the second AC signal, and impedance matching of the drive electrode of the second active element and the transmission line for transmitting the mixed signal, are suitably taken into consideration. Suitably, a coupling capacitor or like element is adequately provided.

DETAILED DESCRIPTION OF THE PREFERRED EMBODIMENTS

Figure 7:
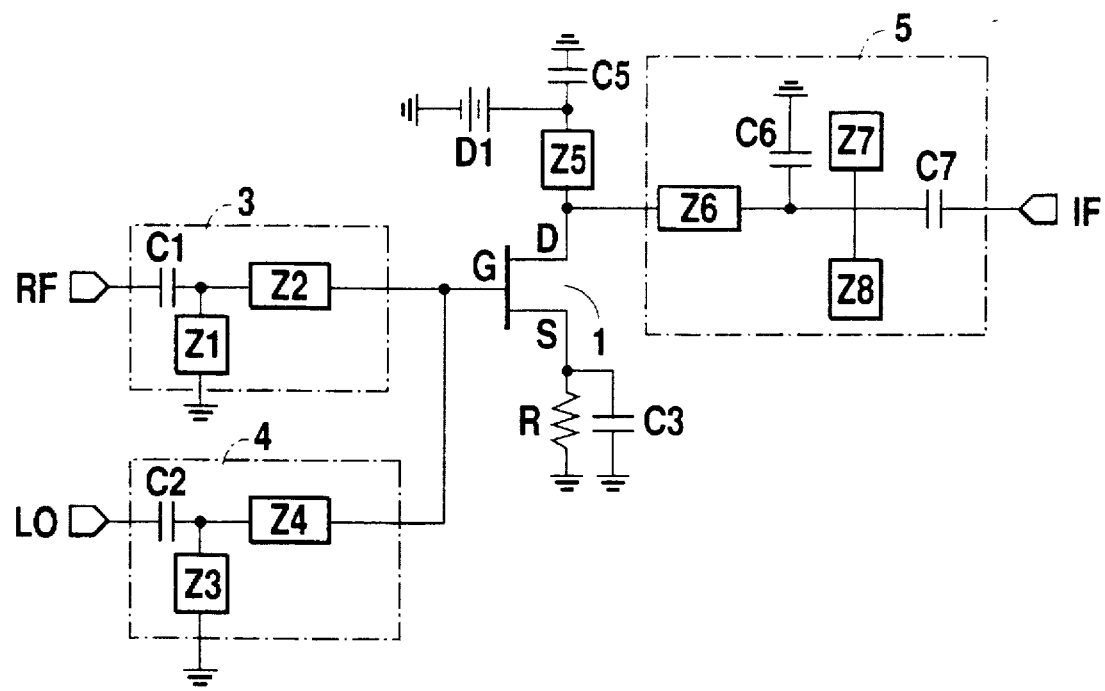
FIG. 7 is a circuit diagram showing the structure of a first prior art down-converter.
Figure 8:
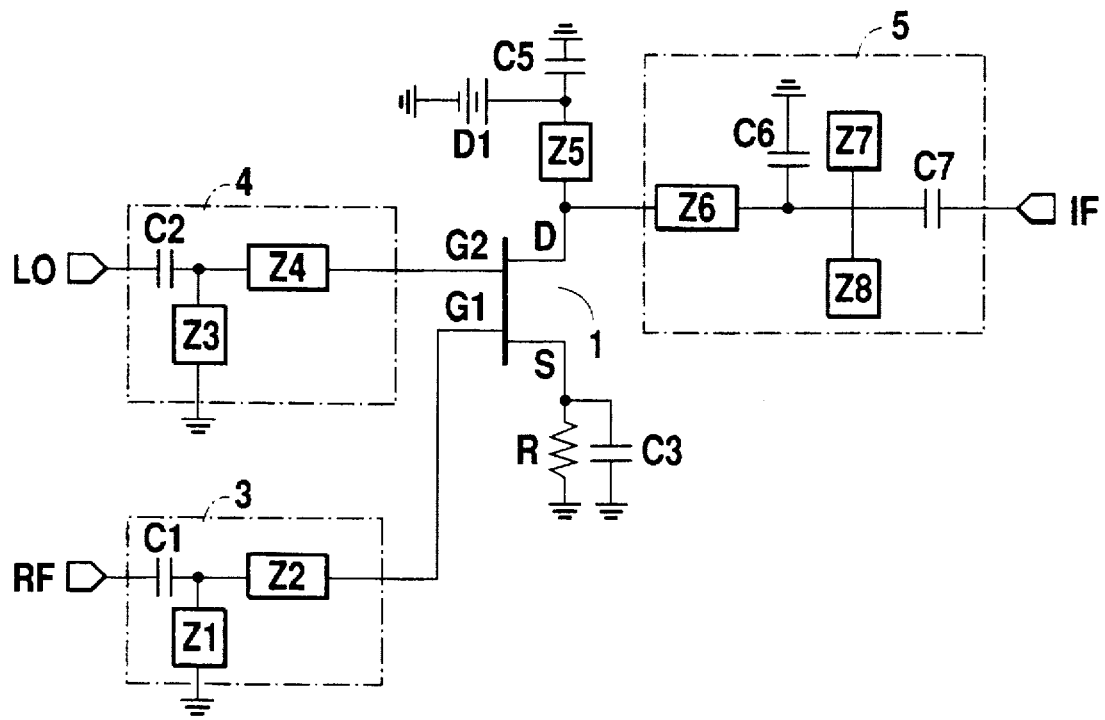
FIG. 8 is a circuit diagram showing the structure of a second prior art down-converter.
Figure 9:
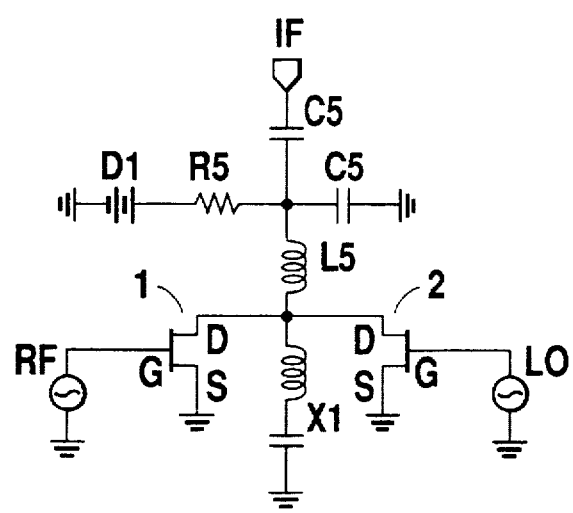
FIG. 9 is a circuit diagram showing the structure of a third prior art down-converter.

Preferred embodiments of the invention now will be described with reference to the drawings. Parts like or common to those in the prior art structures shown in FIGS. 7 to 9 are designated by like reference numerals and symbols and not further described.

a) First Embodiment

Figure 1:
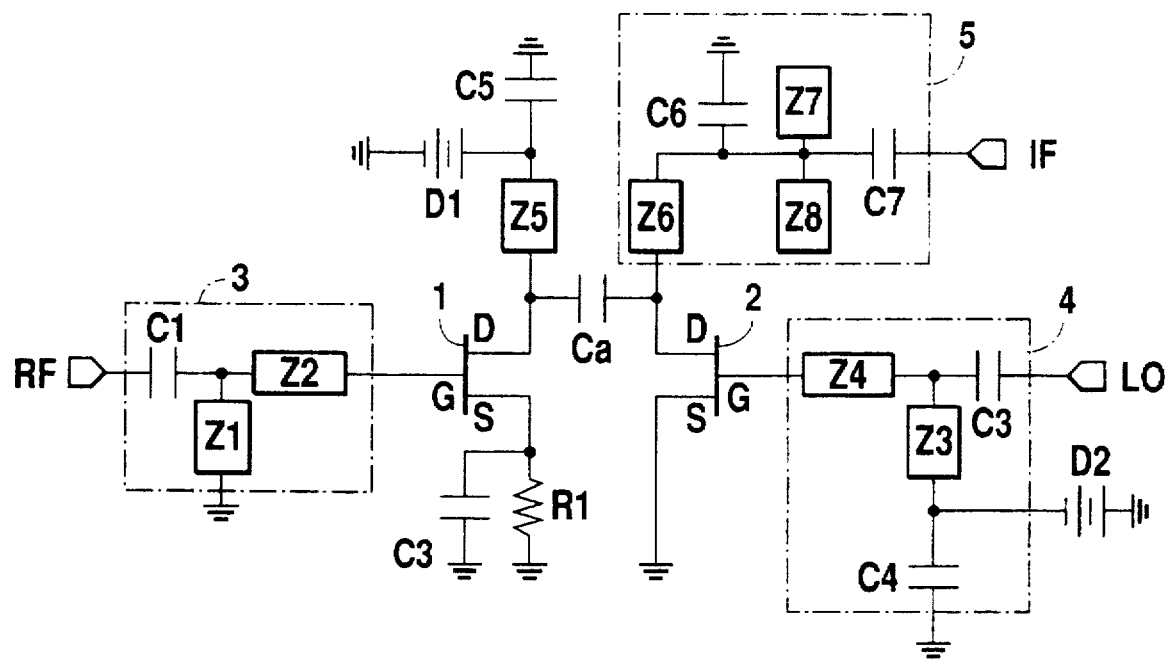
FIG. 1 is a circuit diagram showing the structure of a down-converter concerning a first embodiment of the invention.

FIG. 1 shows the structure of a down-converter according to a first embodiment of the invention. Unlike the FIG. 7 prior art structure in which the RF and LO signals are both supplied to the gate G of the FET 1, in this embodiment a single RF signal is supplied to the gate G of FET 1, and an LO signal is supplied to the gate G of FET 2. The FETs 1 and 2 are both MES (metal semiconductor junction) FETs, for example, and their gates G have an equal width (for instance 400 μm). The RF signal supplied through input matching circuit 3 to the gate G of the FET 1, is amplified by the FET 1 as in the FIG. 7 prior art down-converter. The drains D of the FETs 1 and 2 are coupled together by capacitor Ca. The capacitor Ca removes the DC component (of about 1.7 mA, for instance) from the amplified RF signal that appears on the drain D of the FET 1. An amplified RF signal free from the DC component is consequently supplied to the drain D of the FET 2. The LO signal is supplied to the gate G of the FET 2 via the input matching circuit 4. The FET 2 mixes the LO signal and the amplified RF signal noted above supplied to the drain D. The mixed signal obtained through mixing of the RF and LO signals is provided as an IF signal through an output matching circuit 5. The capacitance of the capacitor Ca is set according to parameters of other circuit elements and to attain desired functions.

The FET 2, unlike the FET 1, is not provided with supply voltage at the drain D. Instead, a negative bias voltage is applied to the gate G. The negative bias voltage is applied to the gate G of the FET 2 in order to lower the knee voltage of the FET 2. The term "knee voltage" generally means the drain-source DC voltage which can cause DC current in the FET drain to reach a saturation region. In general, the FET provides better mixing performance when the drain-source DC voltage is in the vicinity of the knee voltage. With the negative bias voltage applied to the gate G of the FET 2, mixing of the RF and LO signals can be obtained without the application of DC voltage from power supply D1 between the drain and source of the FET 2, that is, by merely applying low voltage as the RF signal. Besides, there is no possibility of a large current flowing through the drain G of the FET 2. In order to permit application of the bias voltage to the gate G of the FET 2, the input matching circuit 4 is connected to power supply D2 on the ground side of impedance element Z3. Capacitor C4 for AC biasing the power supply D2 is provided between the impedance element Z3 and ground. Capacitor C4 has, in addition to the function described above, a function of preventing the output of the power supply D2 appearing at the LO signal output terminal.

As shown, in this embodiment the RF and LO signals are supplied to different parts of the system (i.e., the former to the FET 1 and the latter to the FET 2), and hence the inter-terminal isolation is improved compared to the prior art system of FIG. 7. As an example of this embodiment, a down-converter can be realized such that the RF signal leakage power to the LO signal input terminal is less than the RF signal input power by 13 dB, the LO signal leakage power to the RF signal input terminal is less than the LO signal input power by 58 dB, the RF signal leakage power to the IF signal output terminal is less than the RF signal input power by 14 dB, and the LO signal leakage power to the IF signal input terminal is less than the LO signal input power by 29 dB.

Figure 2:
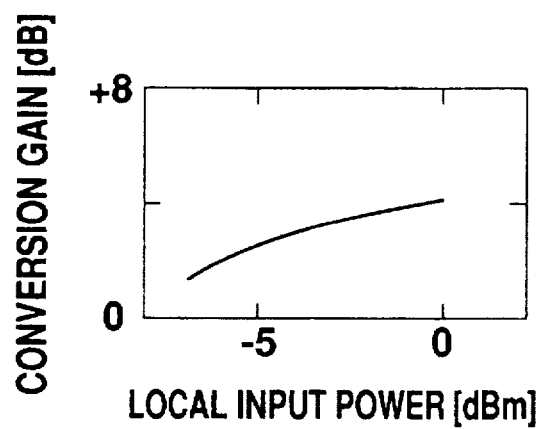
FIG. 2 is a graph showing a conversion gain versus local input power characteristic of the FIG. 1 embodiment.

A further merit of this embodiment in which the conversion gain is improved compared to the structure in which the LO signal is supplied to the source S, instead of the gate G, of the FET 1 in FIG. 7. Specifically, it is possible to realize a conversion gain versus local input power characteristic as shown in FIG. 2. In this example, the conversion gain is +4 dB with a local input power of about 0 dBm and +1 dB with a local input power of −7 dBm and above. These conversion gain values represent a pronounced improvement over the system according to Japanese Patent Laid-Open Publication No. Hei 6-104651, in which the conversion gain is about 0 dB with a local input power of about 10 dBm. The above merit permits LO signal power reduction and also size reduction and power supply simplification of a receiver which incorporates the down-converter of this embodiment.

Figure 3:
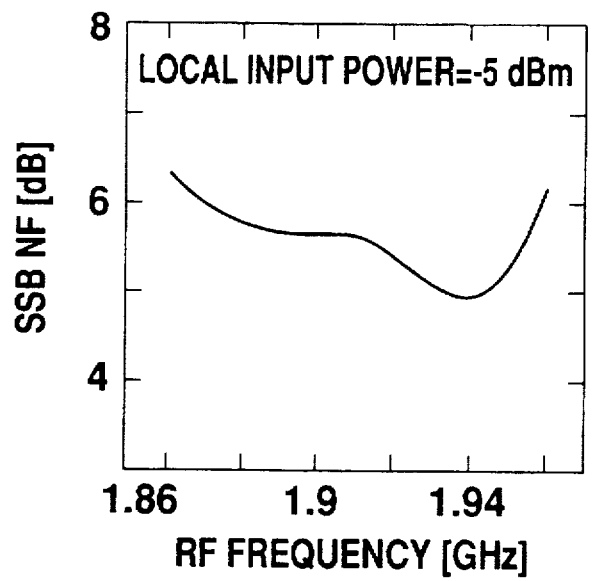
FIG. 3 is graph showing a SSB (single-sideband) NF versus RF Frequency characteristic of the FIG. 1 embodiment.
Figure 4:
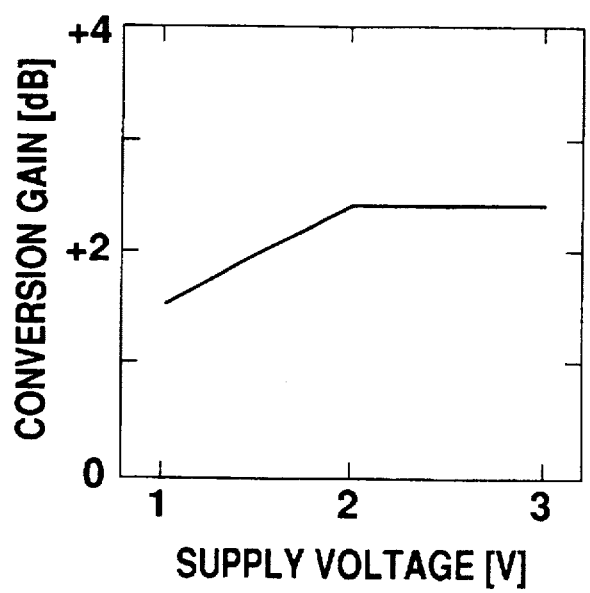
FIG. 4 is a graph showing a conversion gain versus supply voltage characteristic of the FIG. 1 embodiment.

In a further aspect, the FETs 1 and 2 used in this embodiment are single-gate FETs, which permit NF reduction compared to the FIG. 8 structure. For example, it is possible to hold the SSB NF within 6 dB in a broad frequency range from 1.86 to 1.94 GHz and to realize a low noise down-converter. In the graph of FIG. 3, it is assumed that the local input power is −5 dBm.

Moreover, in this embodiment it is only a single FET (i.e., FET 1) that receives the drain current supplied from the power supply D1, and power consumption is reduced. Further, the mixing operation is brought about in the FET 2, particularly at the drain D thereof, which ensures that regardless of lowering of the voltage of the power supply D1 from the normal value, for instance +3 V, to a lower value, for instance, +2 V, the conversion gain is substantially the same as the normal value, for instance +2.4 dB. This means that the mixing operation is stable even with supply voltage variations.

b) Second Embodiment

Figure 5:
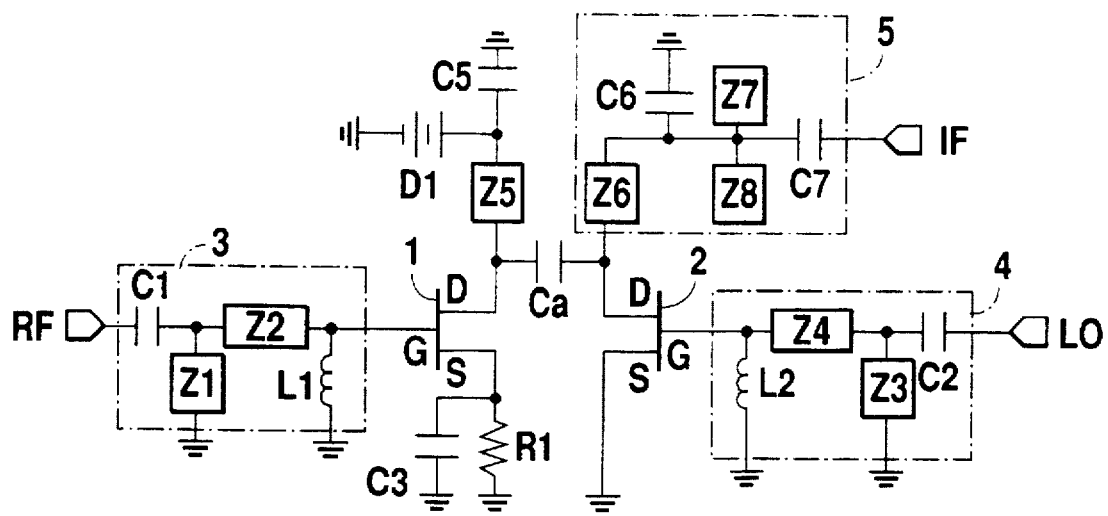
FIG. 5 is a circuit diagram showing the structure of a down-converter concerning a second embodiment of the invention.

FIG. 5 shows the structure of a down-converter according to a second embodiment of the invention. For the sake of brevity, parts similar to those of the preceding first embodiment are designated by like reference numerals and symbols and not further described. In this embodiment, input matching circuits 3 and 4 have inductors L1 and L2 respectively connecting the gates G of FETs 1 and 2 to ground. This means that no DC voltage is applied to the gates G of the FETs 1 and 2. This embodiment does not use power supply D2 and capacitor C4.

Figure 6:
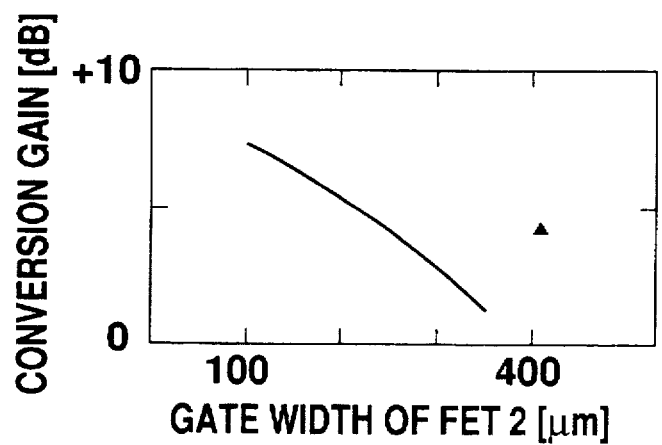
FIG. 6 is a graph showing a conversion gain versus local oscillator side FET gate width characteristic of the FIG. 5 embodiment.

It is made possible to dispense with the power supply D2 and capacitor C4 by reducing the width of the gate G of the FET 2 to, for instance, ¼ to ¹⁄₁.₃ of the width of the FET 1. This is done because FET gate width reduction generally lowers the knee voltage. With the down-converter structure of this embodiment, the conversion gain is increased by reducing the width of the gate G of the FET 2, as shown in FIG. 6. The setting of the width of the gate G of the FET 2 as above permits the same effects as in the first embodiment to be obtained without the use of power supply D2. Besides, the circuit structure is simplified compared to the first embodiment. In the graph of FIG. 6, it is assumed that the width of the gate G of the FET 2 is 400 μm. In the Figure, the point shown as a black triangle represents the conversion gain in the case in which the gates of the FETs 1 and 2 both have a width of 400 m and also the power supply D2 as shown in FIG. 1 is used.

c) Supplement

While the foregoing description has dealt with down-converters for converting an RF signal into an IF signal, the invention is also applicable to down-converters for other purposes, and also to up-converters. The invention is also applicable not only to frequency converters but also to general mixers for mixing a plurality of signals. Furthermore, while the foregoing description has dealt with FETs as an example of an amplifying and mixing active element, it is possible to use other types of active elements as well, so long as their amplifying and mixing operation can be caused by applying as low a voltage as approximately signal voltage to the drive electrode (i.e., drain in case of the FET). Among applications of the mixer according to the invention are microwave band (i.e., 1 to 3 GHz) radio LAN (local area network) stations and radio units of portable telephone sets used in PHSs (personal handy phone systems) and DECTs (digital European cordless telephones).

What is claimed is:

1. A mixer comprising:

a first active element having at least a control electrode and a drive electrode, the first active element amplifying a first AC signal supplied to the control electrode in the presence of a supply voltage on the drive electrode, the amplified first AC signal being provided from the drive electrode;

a second active element having at least a control electrode and a drive electrode, the second active element mixing a second AC signal supplied to the control electrode, of the second active element, with the amplified first AC signal supplied to the drive electrode of the second active element when the second active element is in a saturation region, the operation in the saturation region being provided by applying a predetermined negative DC bias voltage to the control electrode of the second active element while no DC voltage is directly applied to the drive electrode of the second active element, a mixed AC signal is obtained and provided from the drive electrode of the second active element as a result of the mixing ;

first drive means for supplying the first AC signal to the control electrode of the first active element while applying the supply voltage to the drive electrode of the first active element;

second drive means for supplying the second AC signal to the control electrode of the second active element; and output means for providing, after obtaining the mixed AC signal from the drive electrode of the second active element, a mixed output signal having a frequency corresponding to a sum of or difference between the frequencies of the first and second AC signals.

2. A mixer comprising:

a first active element having at least a control electrode and a drive electrode, the first active element amplifying a first AC signal supplied to the control electrode in the presence of a supply voltage on the drive electrode, the amplified first AC signal being provided from the drive electrode;

a second active element having at least a control electrode and a drive electrode, the second active element mixing a second Ac signal supplied to the control electrode of the second active element with the amplified first AC signal supplied to the drive electrode of the second active element when the second active element is in a saturation region, a mixed AC signal is obtained and provided from the drive electrode of the second active element as a result of the mixing, wherein the first and second active elements are field-effect transistors;

first drive means for supplying the first AC signal to the control electrode of the first active element while applying the supply voltage to the drive electrode of the first active element;

second drive means for supplying the second AC signal to the control electrode of the second active element;

output means for providing, after obtaining the mixed AC signal from the drive electrode of the second active element, a mixed output signal having a frequency corresponding to a sum of or difference between the frequencies of the first and second AC signals; and saturation holding means for holding a DC current in the drive electrode of the second active element in the saturation region by lowering the knee voltage of the second active element.

3. The mixer according to claim 2, wherein the saturation holding means includes a bias power supply for lowering the knee voltage of the second active element by applying a negative DC voltage to the control electrode of the second active element such that the mixing operation of the second active element is performed using an AC current supplied from the drive electrode of the first active element to the drive electrode of the second active element.

4. The mixer according to claim 3, wherein the saturation holding means includes means for isolating the bias power supply from the second AC signal so that the second AC signal is not supplied to the bias power supply.

5. The mixer according to claim 2, wherein the width of the control electrode of the second active element is narrower than that of the first active element.

6. The mixer according to claim 2, wherein the first drive means includes:

means for matching the impedance of the control electrode of the first active element to the impedance of a transmission line for transmitting the first AC signal; and means for eliminating DC current flowing from the transmission line for transmitting the first AC signal into the control electrode of the first active element.

7. The mixer according to claim 2, wherein the second drive means includes:

means for matching the impedance of the control electrode of the second active element to the impedance of a transmission line for transmitting the second AC signal;

means for eliminating DC current flowing from the transmission line for transmitting the second AC signal into the control electrode of the second active element; and means for eliminating DC current flowing from the drive electrode of the first active element into the drive electrode of the second active element.

8. The mixer according to claim 2, wherein the output means includes:

means for matching the impedance of the drive electrode of the second active element and the impedance of a transmission line for transmitting the mixed output signal; and means for eliminating the DC current flowing from the drive electrode of the second active element into the transmission line for transmitting the mixed output signal.

9. A frequency conversion process comprising the steps of:

preparing first and second field-effect transistors, each having a gate, a drain and a source;

applying a first AC signal voltage to the gate of the first field-effect transistor while applying a DC supply voltage between the drain and source of the first field-effect transistor;

applying a second AC signal voltage to the gate of the second field-effect transistor and a signal voltage between the drain and source of the second field-effect transistor, the signal voltage being obtained by removing a DC component from the drain-source voltage across the first field-effect transistor, while also applying a negative bias voltage to the gate of the second field-effect transistor to lower the knee voltage of the second field-effect transistor so as to permit a mixing operation of the second field-effect transistor using an AC component of a drain current in the first field-effect transistor; and outputting, using the drain-source voltage across the second field-effect transistor, a mixed signal voltage having a frequency corresponding to a sum of, or difference between, the frequencies of the first and second AC signal voltages.

10. A frequency conversion process comprising the steps of:

preparing first and second field-effect transistors, each having a gate, a drain and a source, the gate of the second field-effect transistor having a width smaller than the width of the gate of the first field-effect transistor, wherein the second field-effect transistor operates in a saturation region;

applying a first AC signal voltage to the gate of the first field-effect transistor while applying a DC supply voltage between the drain and source of the first field-effect transistor;

applying a second AC signal voltage to the gate of the second field-effect transistor and a signal voltage between the drain and source of the second field-effect transistor, the signal voltage being obtained by removing a DC component from the drain-source voltage of the first field-effect transistor; and outputting, using the drain-source voltage across the second field-effect transistor, a mixed signal voltage having a frequency corresponding to a sum of, or difference between, the frequencies of the first and second AC signal voltages.

* * * * *